United States Patent
Schug

(10) Patent No.: US 9,614,128 B2
(45) Date of Patent: Apr. 4, 2017

(54) SURFACE MOUNTABLE SEMICONDUCTOR DEVICE

(71) Applicant: KONINKLIJKE PHILIPS N.V., Eindhoven (NL)

(72) Inventor: Josef Andreas Schug, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/402,212

(22) PCT Filed: May 7, 2013

(86) PCT No.: PCT/IB2013/053665
§ 371 (c)(1),
(2) Date: Nov. 19, 2014

(87) PCT Pub. No.: WO2013/175333
PCT Pub. Date: Nov. 28, 2013

(65) Prior Publication Data
US 2015/0287889 A1 Oct. 8, 2015

Related U.S. Application Data

(60) Provisional application No. 61/650,522, filed on May 23, 2012.

(51) Int. Cl.
*H01L 33/48* (2010.01)
*H01L 23/367* (2006.01)
(Continued)

(52) U.S. Cl.
CPC ........ *H01L 33/486* (2013.01); *H01L 23/3677* (2013.01); *H01L 25/0753* (2013.01);
(Continued)

(58) Field of Classification Search
CPC ........................................................ F21K 9/00
See application file for complete search history.

(56) References Cited

U.S. PATENT DOCUMENTS

2006/0131602 A1* 6/2006 Ouderkirk ............. H01L 33/642
257/100
2011/0140150 A1 6/2011 Shum
(Continued)

FOREIGN PATENT DOCUMENTS

DE 102010029529 A1 12/2011
JP 2003168829 A 6/2003
(Continued)

OTHER PUBLICATIONS

EPO as ISA, International Search Report and Written Opinion mailed Sep. 6, 2013 from International Application No. PCT/IB2013/053665 filed May 7, 2013, 8 pages.
(Continued)

*Primary Examiner* — Kyoung Lee
*Assistant Examiner* — Ratisha Mehta

(57) ABSTRACT

The present invention relates to a surface mountable semiconductor device comprising at least one semiconductor element mounted on or integrated in a device substrate (1) having a top surface and a bottom surface. One or several electrical pads (2) of a first height and at least one thermal pad (3) of a second height are arranged at the bottom surface of the device substrate (1). In the proposed surface mountable semiconductor device the height of the thermal pad (3) is larger than the height of the electrical pads (2). This allows the mounting of such a device to an IMS with a locally removed dielectric layer in an easy and reliable manner in order to directly connect the thermal pad with the metallic substrate of the IMS.

17 Claims, 1 Drawing Sheet

(51) Int. Cl.
H01L 33/62 (2010.01)
H01L 33/64 (2010.01)
H01L 25/075 (2006.01)
H05K 1/18 (2006.01)

(52) U.S. Cl.
CPC ............ *H01L 33/62* (2013.01); *H01L 33/642* (2013.01); *H05K 1/181* (2013.01); *H01L 2924/0002* (2013.01); *H05K 2201/10106* (2013.01)

(56) References Cited

U.S. PATENT DOCUMENTS

2011/0180819 A1* 7/2011 Van Elmpt et al. ............ 257/88
2011/0233580 A1   9/2011 Bierhuizen et al.
2013/0299960 A1* 11/2013 Chan ............................ 257/706

FOREIGN PATENT DOCUMENTS

| JP | 2008524868 A | 7/2008 |
| WO | 2004105142 A1 | 12/2004 |
| WO | 2005067063 A1 | 7/2005 |

OTHER PUBLICATIONS

Notice of Reasons for Rejection dated Jan. 10, 2017 from Japanese Patent Application No. 2015-513302.

* cited by examiner

SURFACE MOUNTABLE SEMICONDUCTOR DEVICE

CROSS-REFERENCE TO PRIOR APPLICATIONS

This application is the U.S. National Phase application under 35 U.S.C. §371 of International Application No. PCT/IB13/053665, filed on May 7, 2013, which claims the benefit of U.S. Provisional Patent Application No. 61/650,522, filed on May 23, 2012. These applications are hereby incorporated by reference herein.

FIELD OF THE INVENTION

The present invention relates to a surface mountable semiconductor device comprising at least one semiconductor element mounted on or integrated in a device substrate having a top surface and a bottom surface, and one or several electrical connection pads of a first height and at least one thermal pad of a second height both arranged at the bottom surface of the semiconductor substrate. Surface mountable semiconductor devices of such a type can be mounted on carrier substrates comprising a heat dissipating member in order to effectively release the heat created by the semiconductor elements. Examples of such semiconductor devices are high power LEDs which require the release of heat during operation.

BACKGROUND OF THE INVENTION

Surface mountable semiconductor devices requiring heat dissipation are often mounted on insulated metal substrates (IMS) in order to efficiently remove the heat during operation. Such an insulated metal substrate usually comprises a heat dissipating metal layer, typically a flat sheet metal, covered by an electrically insulating dielectric layer. On the dielectric layer an electrically conductive layer is applied in order to form conductor paths for contacting the mounted semiconductor device. Even a thin layer of dielectric material with a low thermal conductivity however leads to a high thermal resistance in the assembly and thus to an increased junction temperature. This is in particular the case for small devices with a high thermal power dissipation which results in a high power density. Mounting SMT (surface mount technology) devices with an insulated thermal pad, i.e. a pad formed of a highly heat conducting material, on an IMS offers the opportunity to directly bring the thermal pad into good thermal contact with the metal substrate without the usual dielectric layer. To this end, the dielectric layer is not present or removed in the area underneath the thermal pad in order to directly thermally connect the thermal pad to the metal substrate by means of a highly heat conducting interconnect layer.

US 2011/0180819 A1 discloses a surface mountable semiconductor device having two electrical connection pads and a thermal pad at a bottom surface of a substrate on which a LED is mounted. The electrical connection pads and the thermal pads have the same height and are mounted via an interconnect layer to an electrically and thermally conductive layer on a PCB (printed circuit board) substrate. The thermal pad is thermally connected via the conductive layer with a heat release member arranged on the PCB substrate.

When mounting such a surface mountable semiconductor device on an IMS with a dielectric layer locally removed underneath the thermal pad, the interconnect layers between the electrical connection pad and the electrically conductive layer and between the thermal pad and the metal substrate require different amounts of material, like e.g. solder, due to the uneven substrate surface caused by the locally removed dielectric layer. This may lead to connection defects when mounting the semiconductor device on the substrate. Furthermore, a usual cost effective application of the interconnect layer by uniform deposition of a solder paste is not possible in such a case.

SUMMARY OF THE INVENTION

It is an object of the present invention to provide a surface mountable semiconductor device of the above type which may be mounted on an insulated metal substrate with a locally removed dielectric layer in an easy and reliable manner, resulting in a direct thermal connection between the thermal pad and the metal substrate.

The object is achieved with the surface mountable semiconductor device according to claim 1. Claim 8 relates to an arrangement of one or several of the semiconductor devices on an IMS or similar carrier substrate with a heat releasing member. Advantageous embodiments of the semiconductor device or arrangement are subject matter of the dependent claims or are described in the subsequent portions of the description.

The proposed surface mountable semiconductor device comprises at least one semiconductor element mounted on or integrated in a device substrate, in particular a semiconductor substrate, having a top surface and a bottom surface. One or several electrical connection pads of a first height and at least one thermal pad of a second height are both arranged at the bottom surface of the device substrate. The first and second heights relate to the thickness of the electrical connection pads and of the thermal pad on the bottom surface of the device substrate. The semiconductor element may be a light emitting diode (LED), in particular a high power LED. The semiconductor element may also be any other functional element requiring heat dissipation through a thermal pad. In the proposed semiconductor device the second height of the thermal pad is larger than the first height of the electrical connection pad in order to equalize the difference in height between the location of the electrical pad and the location of the thermal pad on the surface of an IMS or similar carrier substrate when mounting the device to such a carrier.

This difference in height allows to mount the proposed device on an IMS with the dielectric layer and electrically conductive layer being not present or removed underneath the thermal pad, by applying an electrically and thermally conductive interconnect layer with equal thickness to the surface of the IMS. Since the interconnect layer can be applied for example by uniform deposition of a solder paste, a highly reliable connection can be achieved in an easy manner. Such a semiconductor device does not require any special preparation of the IMS or similar carrier substrate. The mounting process does not cause extra processing and cost. Examples for interconnect materials or techniques are solders, thermally conductive glue, silver sintering and other connecting techniques known in the art.

The semiconductor device may comprise more than one thermal pad and may also comprise two or more than two electrical connection pads. The thermal pad and the electrical pads are preferably separated from one another by trenches or gaps. In an embodiment of the device, these trenches or gaps are filled with an electrically insulating material.

Typical combined thicknesses of the dielectric layer and the electrically conductive layer on the metallic substrate of an IMS are in the range of between 20 and 300 µm, more typically between 40 and 100 µm. Therefore, in a preferred embodiment of the surface mountable semiconductor device, the difference between the first height and the second height is between 20 and 300 µm, more preferably between 40 and 100 µm. The thermal pad(s) and the electrical pad(s) of the semiconductor device may be made of the same material, preferably of a metal like copper or aluminum. Nevertheless, also other electrically and/or thermally highly conducting materials can be used as known in the art.

The proposed surface mountable semiconductor device may also be formed in WL-CSP (wafer level chip scale package) technology. In this technology the electrical and optional as well the thermal pads are applied on wafer level to an array of semiconductor devices, e. g. LED devices.

The proposed surface mountable device may be mounted on a carrier substrate formed of a metallic plate or metallic core layer covered by a dielectric layer on which an electrically conductive layer is arranged. The electrically conductive layer is appropriately structured/designed to provide the conductor paths and pads for electrically contacting the electrical connection pads of the semiconductor device. The dielectric layer and the electrically conductive layer are not present or removed underneath the thermal pad(s) in order to directly thermally connect the thermal pad(s) by a thermal interconnect layer to the metallic plate or core layer. The electrical connection pads are electrically connected by an electrical interconnect layer to the electrically conductive layer. Such a carrier substrate may be a IMS in which the metallic plate is the metal substrate. Another candidate for such a carrier substrate is a metal core printed circuit board (MC-PCB). Several of the surface mountable semiconductor devices may be mounted on such a carrier substrate in the above described manner.

The proposed surface mountable semiconductor device and corresponding arrangement can be advantageously used in high power LED architecture, e. g. for automotive forward lighting or other lighting applications.

These and other aspects of the invention will be apparent from and elucidated with reference to the embodiments described herein after.

BRIEF DESCRIPTION OF THE DRAWINGS

The proposed surface mountable semiconductor device and arrangement are described in the following by way of examples in connection with the accompanying drawings in further detail. The figures show.

DETAILED DESCRIPTION OF EMBODIMENTS

Figure 1:
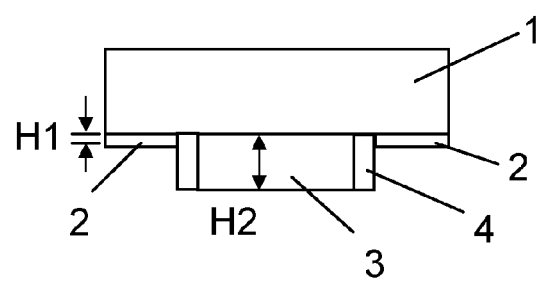
FIG. 1 a schematic cross section through a surface mountable semiconductor device according to the present invention.

An example of the proposed surface mountable semiconductor device is schematically shown in cross section in FIG. 1. The figure shows the device substrate 1 comprising an integrated semiconductor element (not explicitly shown in the figure). This device substrate 1 may be a high power LED-chip. Two electrical connection pads 2 are attached to the bottom surface of the device substrate 1 separated from a thermal pad 3. The electrical pads 2 and the thermal pad 3 may be made of the same material, for example of copper. We do not show optional coatings or platings to prevent oxidation and/or enable reliable (solder) interconnect e.g. gold plating as known in the art. The thermal pad 3 serves as a heat conducting member to release the heat from the device substrate 1 to a heat dissipating member on a carrier substrate to which the semiconductor device will be mounted. The electrical pads 2 and the thermal pad 3 are separated by a gap which is filled with an insulation material 4, for example with an epoxy mold compound (EMC), a silicone mold compound (SMC) or other insulating materials as known in the art.

Figure 2:
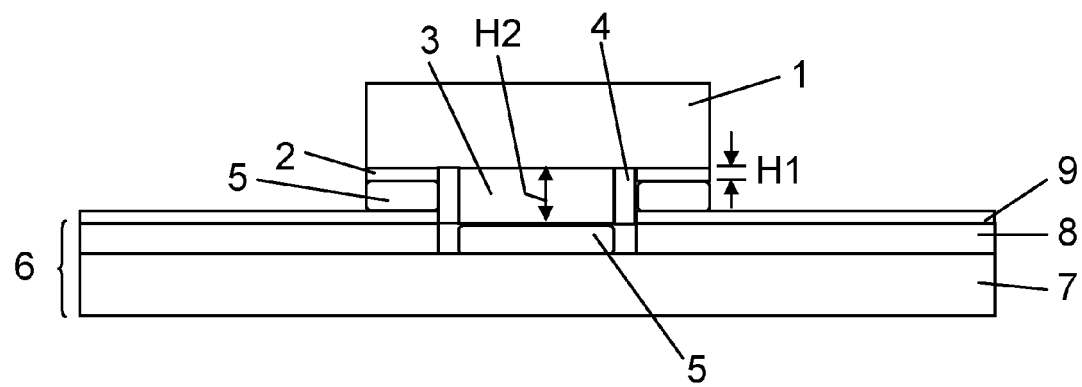
FIG. 2 the semiconductor device of FIG. 1 mounted on a IMS.

The height H1 of the electrical pads 2 is lower than the height H2 of the thermal pad 3 in order to equalize a differences in height of the substrate surface of an IMS-substrate 6 to which this device will be mounted. This is shown in FIG. 2. The IMS-substrate 6 comprises a metal plate 7 with a dielectric layer 8 on top. An electrically conductive layer 9 is arranged on the dielectric layer in order to allow electrically contacting the semiconductor device mounted to this IMS-substrate 6. As can be seen from FIG. 2, the dielectric layer 8 is not present or removed in the area underneath the thermal pad 3 of the mounted device. By providing the thickness of the thermal pad 3 with roughly the combined thickness of the dielectric layer 8 and the electrically conductive layer 9 of the IMS substrate 6, the device can be attached to the IMS substrate 6 by using the same thickness of the interconnect/attach material 5, typically a solder. This allows an easy and reliable mounting process.

When using WL-CSP technologies for fabricating LED devices, the electrical as well as the thermal pads can be applied on wafer level to on array of LED devices. For example, thick copper layers, typically of one to a few hundred microns, are be plated to the wafer substrate in order to achieve the electrical and thermal pads. Since the plating can be performed selective in different areas, i. e. for the different pads, a thickness variation can be realized relatively easily. The copper layer can be plated in a first process phase to the thickness of the electrical pads. The electrical pads are then protected or covered with a photoresist in a second process phase. Then in a third process phase the plating is continued to form the thermal pads to the desired thickness. After this, the protection cover layer is removed resulting in the electrical and thermal pads with the different thicknesses.

While the invention has been illustrated and described in detail in the drawings and forgoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. The features of all claims of the device can be freely combined. Any reference signs in the claims should not be construed as limiting the scope of the invention.

LIST OF REFERENCE SIGNS 1 device substrate with integrated semiconductor element
2 electrical pads
3 thermal pad 4 insulating material
5 attach/interconnect material
6 IMS
7 metallic plate
8 dielectric layer
9 electrically conductive layer

The invention claimed is:

1. A surface mountable semiconductor device comprising:
   at least one semiconductor element mounted on or integrated in a device substrate,
   the device substrate having a top surface and a bottom surface, the top surface being proximate to the at least one semiconductor element and the bottom surface being distal from the at least one semiconductor element,
   one or more electrical connection pads distinct from the device substrate, the one or more electrical connection pads being arranged on the bottom surface of the device substrate, the one or more electrical connection pads having a first height, and
   at least one thermal pad distinct from the device substrate, the at least one thermal pad being arranged on the bottom surface of the device substrate, the at least one thermal pad having a second height that is larger than the first height of the one or more electrical connection pads, wherein the surface mountable semiconductor device is surface mountable through an electrical connection through a bottom of the one or more electrical connection pads,
   wherein the at least one thermal pad is separated from the one or more electrical connection pads by a trench or gap and the trench or gap is filled with an electrically insulating material.

2. The device according to claim 1, wherein the at least one thermal pad is arranged at a central portion of the bottom surface.

3. The device according to claim 1, wherein a difference between the first height and the second height is between 20 and 300 μm.

4. The device according to claim 1, wherein a difference between the first height and the second height is between 40 and 100 μm.

5. The device according to claim 1, wherein the at least one semiconductor element is a light emitting diode.

6. An arrangement of one or several surface mountable semiconductor devices according to claim 1 mounted on a carrier substrate, the carrier substrate at least comprising a metallic plate or metallic core layer covered by a dielectric layer on which an electrically conductive layer is arranged, wherein the electrically conductive layer and the dielectric layer are not present or removed underneath the at least one thermal pad of the device and underneath at least part of the trench or the gap, the at least one thermal pad being thermally connected by a thermal interconnect layer to the metallic plate or metallic core layer and the one or more electrical connection pads being electrically connected by an electrical interconnect layer to the electrically conductive layer.

7. The arrangement of claim 6, wherein the carrier substrate is an insulated metal substrate or a metal core printed circuit board.

8. The arrangement of claim 6, wherein the thermal interconnect layer to the metallic plate or metallic core layer and the electrical interconnect layer of the one or more electrical connection pads and the electrically conductive layer are uniform deposition layers.

9. The arrangement of claim 6, wherein the electrical interconnect layer is a deposition of solder paste.

10. The device according to claim 1, wherein the at least one thermal pad and the one or more electrical connection pads are confined to a region that is no wider than the device substrate.

11. An arrangement, comprising:
    a carrier substrate, the carrier substrate at least comprising a metallic plate or metallic core layer covered by a dielectric layer on which an electrically conductive layer is arranged; and
    a surface mountable semiconductor device mounted on the carrier substrate, the surface mountable semiconductor device comprising:
      at least one semiconductor element mounted on or integrated in a device substrate,
      the device substrate having a top surface and a bottom surface, the top surface being proximate to the at least one semiconductor element and the bottom surface being distal from the at least one semiconductor element,
      one or more electrical connection pads distinct from the device substrate, the one or more electrical connection pads being arranged on the bottom surface of the device substrate, the one or more electrical connection pads having a first height; and
      at least one thermal pad distinct from the device substrate, the at least one thermal pad being arranged on the bottom surface of the device substrate, the at least one thermal pad having a second height that is larger than the first height of the one or more electrical connection pads, wherein the surface mountable semiconductor device is surface mountable through an electrical connection through a bottom of the one or more electrical connection pads;
    wherein:
      the at least one thermal pad is separated from the one or more electrical connection pads by a trench or gap;
      the electrically conductive layer and the dielectric layer are not present or removed underneath the at least one thermal pad of the device and underneath at least part of the trench or the gap;
      the at least one thermal pad being thermally connected by a thermal interconnect layer to the metallic plate or metallic core layer and the one or more electrical connection pads being electrically connected by an electrical interconnect layer to the electrically conductive layer; and
      a difference in height of the first height and the second height equals a sum of thicknesses of the electrically conductive layer and the dielectric layer.

12. An arrangement, comprising:
    a carrier substrate, the carrier substrate at least comprising a metallic plate or metallic core layer covered by a dielectric layer on which an electrically conductive layer is arranged; and
    a surface mountable semiconductor device mounted on the carrier substrate, the surface mountable semiconductor device comprising:
      at least one semiconductor element mounted on or integrated in a device substrate,
      the device substrate having a top surface and a bottom surface, the top surface being proximate to the at least one semiconductor element and the bottom surface being distal from the at least one semiconductor element, one or more electrical connection pads distinct from the device substrate, the one or more electrical connection pads being arranged on the bottom surface of the device substrate, the one or more electrical connection pads having a first height; and at least one thermal pads distinct from the device substrate, the at least one thermal pad being arranged on the bottom surface of the device substrate, the at least one thermal pad having a second height that is larger than the first height of the one or more electrical connection pads, wherein the surface mountable semiconductor device is surface mountable through an electrical connection through a bottom of the one or more electrical connection pads;

wherein:
the at least one thermal pad is separated from the one or more electrical connection pads by a trench or gap;

the electrically conductive layer and the dielectric layer are not present or removed underneath the at least one thermal pad of the device and underneath at least part of the trench or the gap;

the at least one thermal pad being thermally connected by a thermal interconnect layer to the metallic plate or metallic core layer and the one or more electrical connection pads being electrically connected by an electrical interconnect layer to the electrically conductive layer; and the thermal interconnect layer to the metallic plate or metallic core layer has a surface for the at least one thermal pad at the level of the surface of the dielectric layer facing the surface mountable semiconductor device.

13. An arrangement, comprising:
a carrier substrate, the carrier substrate at least comprising a metallic plate or metallic core layer covered by a dielectric layer on which an electrically conductive layer is arranged; and a surface mountable semiconductor device mounted on the carrier substrate, the surface mountable semiconductor device comprising:
at least one semiconductor element mounted on or integrated in a device substrate, the device substrate having a top surface and a bottom surface, the top surface being proximate to the at least one semiconductor element and the bottom surface being distal from the at least one semiconductor element, one or more electrical connection pads distinct from the device substrate, the one or more electrical connection pads being arranged on the bottom surface of the device substrate, the one or more electrical connection pads having a first height; and at least one thermal pad distinct from the device substrate, the at least one thermal pad being arranged on the bottom surface of the device substrate, the at least one thermal pad having a second height that is larger than the first height of the one or more electrical connection pads, wherein the surface mountable semiconductor device is surface mountable through an electrical connection through a bottom of the one or more electrical connection pads;

wherein:
the at least one thermal pad is separated from the one or more electrical connection pads by a trench or gap;

the electrically conductive layer and the dielectric layer are not present or removed underneath the at least one thermal pad of the device and underneath at least part of the trench or the gap;

the at least one thermal pad being thermally connected by a thermal interconnect layer to the metallic plate or metallic core layer and the one or more electrical connection pads being electrically connected by an electrical interconnect layer to the electrically conductive layer; and the thermal interconnect layer to the metallic plate or metallic core layer has a surface for the at least one thermal pad at the level of the surface of the electrically conductive layer facing the surface mountable semiconductor device.

14. A method of forming a surface mountable semiconductor device, the method comprising:
providing at least one semiconductor element mounted on or integrated in a device substrate, the device substrate having a top surface and a bottom surface, the top surface being proximate to the at least one semiconductor element and the bottom surface being distal from the at least one semiconductor element; and forming one or more electrical connection pads of a first height and at least one thermal pad of a second height on the bottom surface of the device substrate such that the surface mountable semiconductor device is surface mountable through an electrical connection through a bottom of the one or more electrical connection pads, the second height of the at least one thermal pad being larger than the first height of the one or more electrical connection pads, the one or more electrical connection pads and the at least one thermal pad being distinct from the device substrate;

wherein:
the at least one thermal pad is separated from the one or more electrical connection pads by a trench or gap;

a difference in height of the first height and the second height equals a sum of thicknesses of a dielectric layer on a carrier substrate and an electrically conductive layer on the dielectric layer, or a thermal interconnect layer to a metallic plate or metallic core layer of the carrier substrate has a surface for the at least one thermal pad at the level of the surface of the dielectric layer facing the surface mountable semiconductor device.

15. The method of claim 14 wherein forming one or more electrical connection pads of a first height and at least one thermal pad of a second height on the bottom surface of the device substrate comprises plating the one or more electrical connection pads and the at least one thermal pad.

16. The method of claim 15 wherein the one or more electrical connection pads and the at least one thermal pad are copper.

17. The method of claim 14 wherein said forming one or more electrical connection pads of a first height and at least one thermal pad of a second height on the bottom surface of the device substrate occurs at a wafer level when the surface mountable semiconductor device is attached to a wafer of semiconductor devices.

\* \* \* \* \*